(12) United States Patent
Fazekas et al.

(10) Patent No.: US 8,095,902 B2
(45) Date of Patent: *Jan. 10, 2012

(54) DESIGN STRUCTURE FOR COUPLE NOISE CHARACTERIZATION USING A SINGLE OSCILLATOR

(75) Inventors: Anthony W. Fazekas, Durham, NC (US); Kenneth Mon Ngai, Essex, VT (US); Joseph J. Oler, Jr., Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 626 days.

This patent is subject to a terminal disclaimer.

(21) Appl. No.: 12/193,058

(22) Filed: Aug. 18, 2008

(65) Prior Publication Data

US 2010/0042960 A1    Feb. 18, 2010

(51) Int. Cl.
G06F 17/50 (2006.01)
G06F 11/22 (2006.01)
G06F 7/38 (2006.01)
H03K 19/173 (2006.01)

(52) U.S. Cl. ........... 716/115; 716/136; 716/138; 326/37

(58) Field of Classification Search .................. 716/138, 716/115–116, 136; 326/37
See application file for complete search history.

(56) References Cited

U.S. PATENT DOCUMENTS

| | | | | |
|---|---|---|---|---|
| 4,377,849 | A  * | 3/1983 | Finger et al. | 716/102 |
| 4,587,480 | A  * | 5/1986 | Zasio | 324/310 |
| 6,105,153 | A  * | 8/2000 | Yamada | 714/724 |
| 6,269,467 | B1 * | 7/2001 | Chang et al. | 716/104 |
| 6,574,127 | B2 | 6/2003 | Hsu et al. | |
| 6,724,681 | B2 * | 4/2004 | Terzioglu et al. | 365/230.06 |
| 6,817,006 | B1 * | 11/2004 | Wells et al. | 716/112 |
| 2004/0216081 | A1 * | 10/2004 | Wells et al. | 716/18 |
| 2007/0001682 | A1 * | 1/2007 | Habitz et al. | 324/500 |
| 2008/0028353 | A1 * | 1/2008 | Lu et al. | 716/13 |
| 2008/0094878 | A1 * | 4/2008 | Joshi et al. | 365/154 |
| 2010/0180246 | A1 * | 7/2010 | Cheung et al. | 716/6 |

* cited by examiner

*Primary Examiner* — Stacy Whitmore
(74) *Attorney, Agent, or Firm* — Gibb I.P. Law Firm, LLC

(57) ABSTRACT

A design structure for a computer-aided design system for generating a functional design model of an integrated circuit design (having nets comprising wires) determines critical parameters for coupling noise between the wires of the nets and acceptable limits for the critical parameters. Further, methods herein include designing a ring oscillator to have stages, each of the stages measuring only one of the critical parameters. This ring oscillator is then included within an integrated circuit design and associated design structure. The embodiments herein produce an integrated circuit according to this integrated circuit design and operate the ring oscillator within the integrated circuit to measure the critical parameters of the integrated circuit and produce test results. These test results are output to determine whether the test results are within the acceptable limits.

20 Claims, 8 Drawing Sheets

| PHASE 1 | PHASE 0 | COUPLE ENABLE 1 | COUPLE ENABLE 0 | AGGRESSOR BELOW | AGGRESSOR ABOVE |
|---|---|---|---|---|---|
| X | X | 0 | 0 | HIGH | HIGH |
| X | 0 | 0 | 1 | HIGH | IN-PHASE COUPLING |
| 0 | X | 1 | 0 | IN-PHASE COUPLING | HIGH |
| 0 | 0 | 1 | 1 | IN-PHASE COUPLING | IN-PHASE COUPLING |
| X | 1 | 0 | 1 | HIGH | OUT-OF-PHASE COUPLING |
| 1 | X | 1 | 1 | OUT-OF-PHASE COUPLING | HIGH |
| 1 | 1 | 1 | 1 | OUT-OF-PHASE COUPLING | OUT-OF-PHASE COUPLING |
| 0 | 1 | 1 | 1 | IN-PHASE COUPLING | OUT-OF-PHASE COUPLING |
| 1 | 0 | 1 | 1 | OUT-OF-PHASE COUPLING | IN-PHASE COUPLING |

FIG. 3

DESIGN STRUCTURE FOR COUPLE NOISE CHARACTERIZATION USING A SINGLE OSCILLATOR

CROSS REFERENCE TO RELATED APPLICATIONS

This application is related to the following co-pending application filed concurrently herewith by the same Applicants and assigned to the same Assignee, namely, International Business Machines Corporation (IBM Corporation): "DESIGN STRUCTURE FOR COUPLE NOISE CHARACTERIZATION USING A SINGLE OSCILLATOR," Ser. No. 12/193,059. The complete disclosure of this related co-pending application is incorporated herein by reference.

BACKGROUND

1. Field of the Invention

The embodiments of the invention generally relate to a design structure, and more specifically to a design structure, method, integrated circuit, program storage device, etc., that provides a ring oscillator which has individual stages each dedicated to a specific critical parameter relating to coupling noise between nets.

2. Description of the Related Art

Coupling noise on wires greatly affects performance and timing in application specific integrated circuit (ASIC) chips. If improper modeling occurs, setup and hold issues could occur on such chips. Current design techniques provide information about coupling noise, but differences in layout placement and wiring introduce modeling errors.

SUMMARY OF THE INVENTION

In order to address such issues, this invention eliminates physical differences between nets that could suffer from coupling noise, allowing complete modeling to be focused on coupling effects only. This invention allows many different coupling effects to be measured using a single ring oscillator. Further, wire lengths can be varied using this technique.

A method herein, in a computer-aided design system for generating a functional design model of an integrated circuit design (having nets comprising wires) determines critical parameters for coupling noise between the wires of the nets and acceptable limits for the critical parameters. Further, methods herein design a ring oscillator to have stages, each of the stages measuring only one of the critical parameters. This ring oscillator is then included within an integrated circuit design. The embodiments herein actually produce an integrated circuit according to this integrated circuit design and operate the ring oscillator within the integrated circuit to measure the critical parameters of the integrated circuit and produce test results. These test results are output to determine whether the test results are within the acceptable limits. If the test results are not within the acceptable limits, the embodiments herein simulate the ring oscillator using timing measurements.

The stages of the ring oscillator measure in-phase coupling, and the stages of the ring oscillator measure out-of-phase coupling. Similarly, the stages of the ring oscillator measure an aggressor net below a victim net, and the stages of the ring oscillator measure an aggressor net above the victim net.

When designing the ring oscillator, each of the stages is designed to have identical placement and wiring. Further, the ring oscillator is positioned within the integrated circuit design such that no wires intersect the ring oscillator.

An apparatus embodiment and design structure embodiment herein comprises an integrated circuit manufactured according to such an integrated circuit design. Therefore, the integrated circuit has nets that comprise wires. Again, the integrated circuit design used to manufacture the integrated circuit has critical parameters for coupling noise between the wires of the nets and acceptable limits for the critical parameters.

Further, the integrated circuit has a ring oscillator operatively connected to the nets. A gate array isolator can be used under the nets and surrounding the ring oscillator to isolate the nets and the ring oscillator from other designs within the integrated circuit.

The ring oscillator again has stages, each of the stages measuring one of the critical parameters. The ring oscillator produces the test results by measuring the critical parameters and the ring oscillator includes an output that can output such test results.

The nets comprise relative aggressor nets and relative victim nets, depending upon which net is being tested. The aggressor nets and the victim nets are laid out identically within the integrated circuit.

Also disclosed herein are embodiments of a design structure for the above-mentioned circuit. This design structure can be embodied in a machine readable medium used in a design process, can reside on storage medium as a data format used for the exchange of layout data of integrated circuits. Furthermore, this design structure can comprise a netlist and can include test data, characterization data, verification data, and/or design specifications.

BRIEF DESCRIPTION OF THE DRAWINGS

The embodiments of the invention will be better understood from the following detailed description with reference to the drawings, which are not necessarily drawing to scale and in which:

FIG. 3 is chart illustrating the operation of stages within the ring oscillator shown in FIG. 1, according to embodiments herein;

DETAILED DESCRIPTION

The embodiments of the invention and the various features and advantageous details thereof are explained more fully with reference to the non-limiting embodiments that are illustrated in the accompanying drawings and detailed in the following description.

The embodiments described below accurately predict coupled noise on adjacent wires, which is highly useful in ASIC designs. This invention measures various coupling effects on adjacent wires using a single ring oscillator, which allows for measurements on isolated nets, and allows for correlation and verification of coupling models and wire models.

Figure 1:
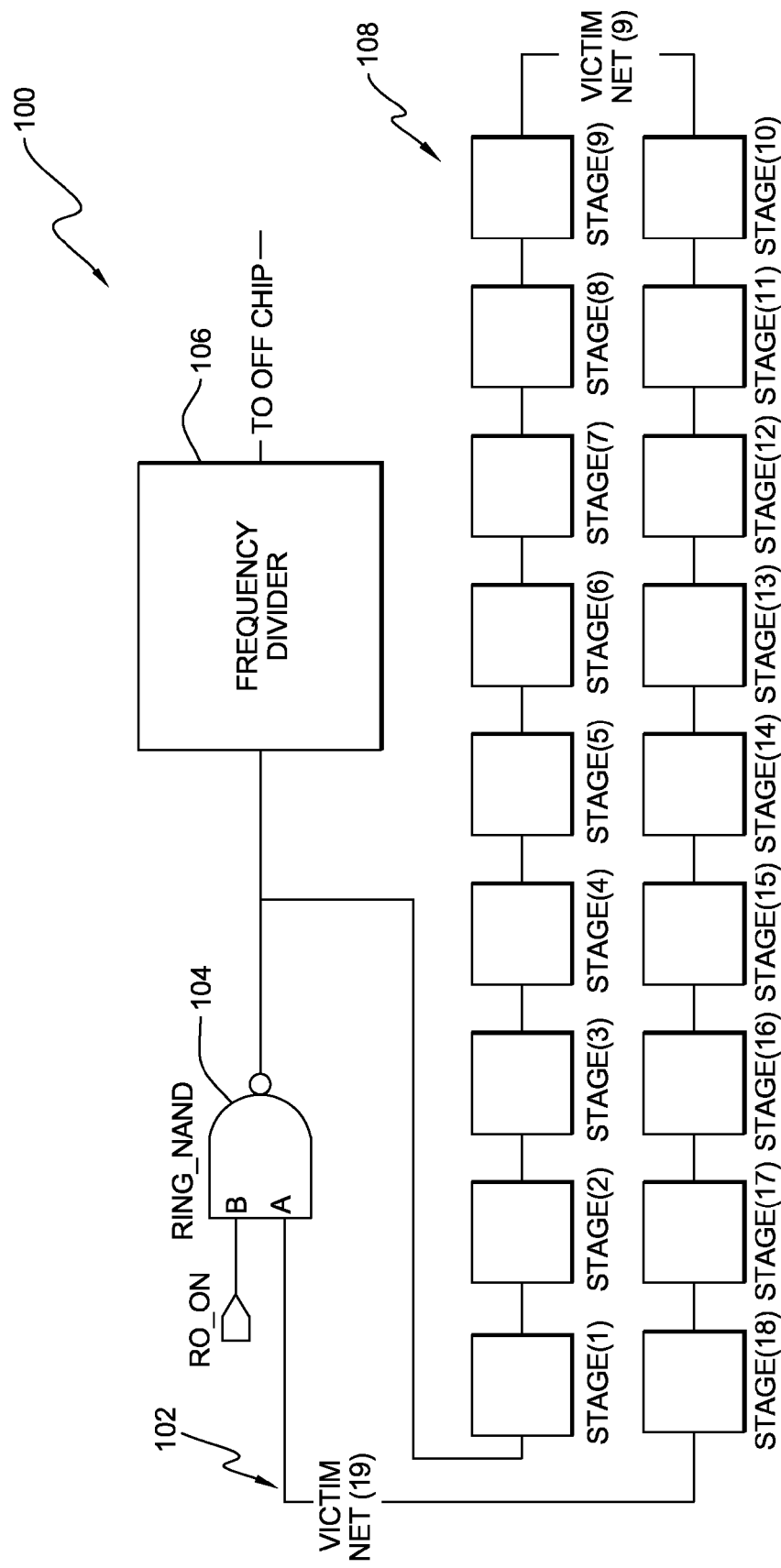
FIG. 1 is schematic diagram of a ring oscillator according to embodiments herein.

As shown in FIG. 1, embodiments herein design, provide, and use a single ring oscillator design and structure 100 that is implemented to perform model to hardware correlation for verification of coupling noise on nets. This single structure 100 accurately measures coupling effects (in-phase, out-of-phase, and uncoupled long-wires) through frequency measurements. Thus, this single oscillator 100 can measure both in-phase and out-of-phase coupling. This design eliminates physical layout offsets by using a single oscillator 100 so only the coupling effect will be measured.

More specifically, the embodiments herein present a design structure, method, integrated circuit, program storage device, etc., for characterizing coupled noise between semiconductor wires. The embodiments herein use the measured results to verify wire models. The structure can include one or more ring oscillators, such as the ring oscillator 100 shown in FIG. 1, and control circuitry, 104, 106.

The ring oscillator structure 100 includes a predetermined number of stages 108 (each stage having an identical structure to be measured) connected to a victim net 102. An AND gate 104 selectively connects the stages 108 to a frequency divider 106. This structure is adapted to allow measurements with at least the following variables; drive strength, wire length, wire width, wire level, wire spacing, and the phase of the coupling signal.

Figure 2:
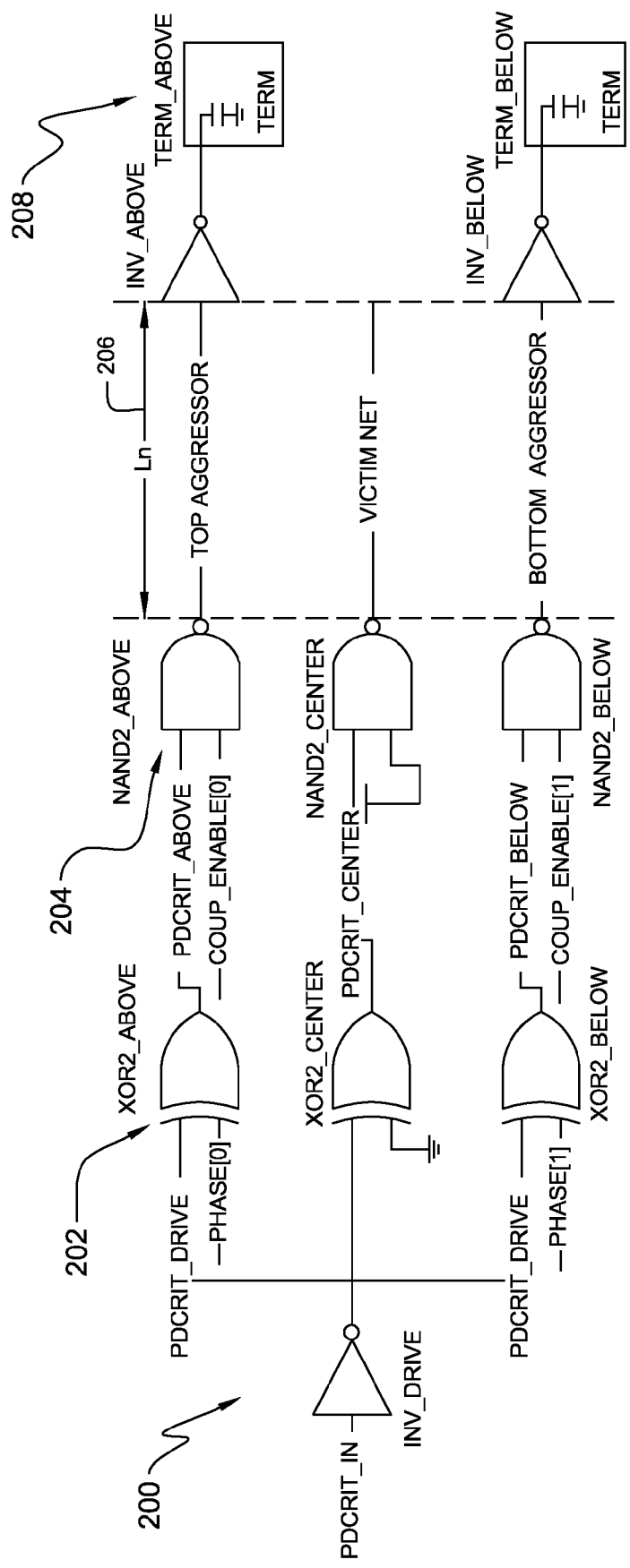
FIG. 2 is schematic diagram of a stage within the ring oscillator shown in FIG. 1, according to embodiments herein.

FIG. 2 illustrates one of the stages 108 in greater detail. More specifically, item 200 shows the input INV which supplies the input signal to the XOR logical units 202. The units 202 include an XOR2_ABOVE which is for the aggressor net above the victim net, an XOR2_CENTER for the victim net, and an XOR2_BELOW which is for the aggressor net below the victim net. Item 206 represents the aggressor and victim nets and item 208 represents the output of the stage.

FIG. 3 illustrates one example where nine stages could be utilized within the ring oscillator 100. As shown in FIG. 3, each stage is used to measure one critical parameter (in phase, out of phase, coupled, not coupled, aggressor above, aggressor below, etc.). While FIG. 3 illustrates one example of how the stages could be used, one ordinarily skilled in the art would understand that the stages could be used for any specific parameter that a designer needed to measure. Therefore, the uses of the stages shown in FIG. 3 are only an example, and the embodiments herein are not limited to this example and the stages herein can be used to measure any critical parameter.

Figure 4:
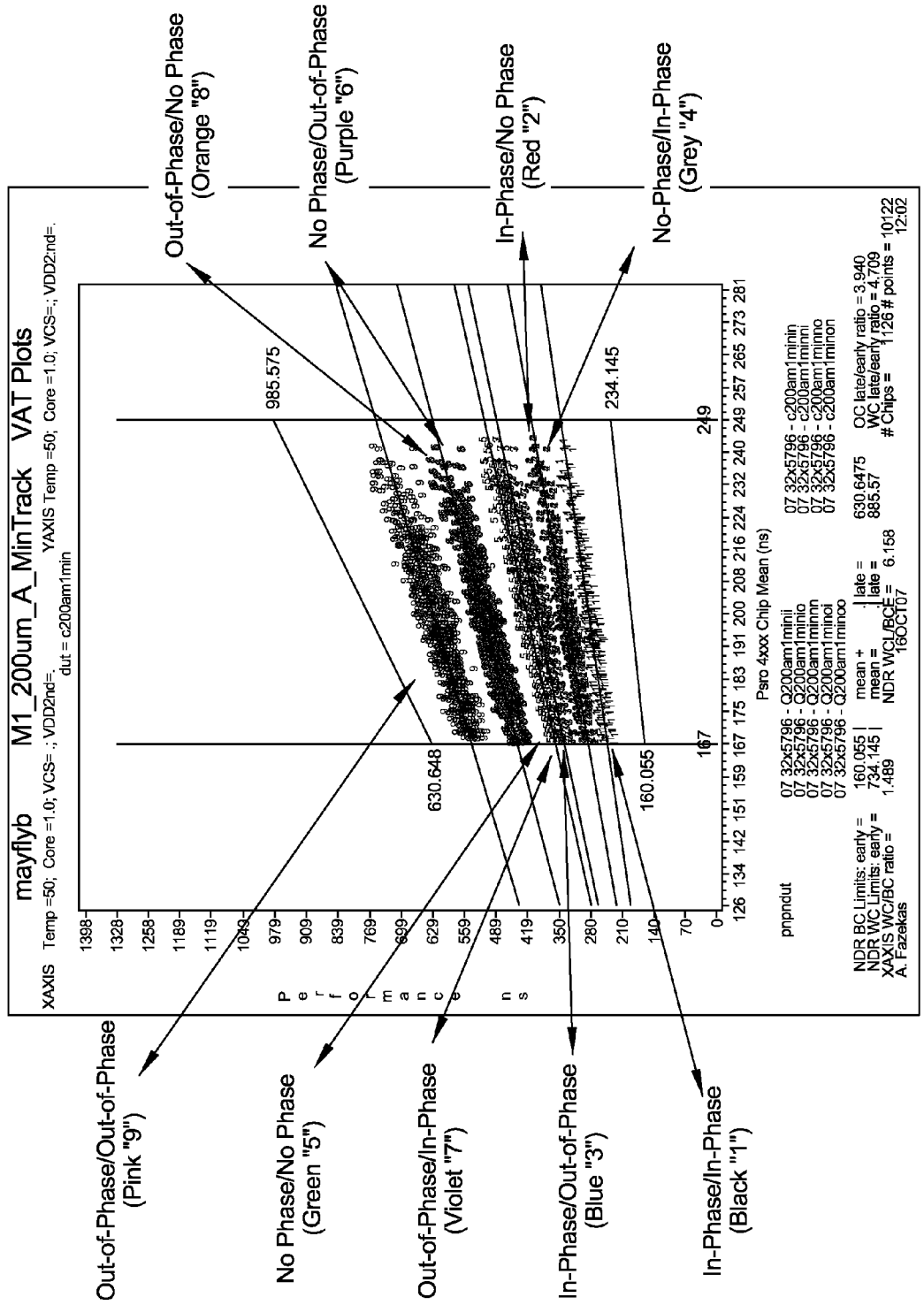
FIG. 4 is a graphic representation of the output from the ring oscillator shown in FIG. 1, according to embodiments herein.

FIG. 4 shows a Variation Aware Timing (VAT) plot (a method that correlates NDR (New Delay Rules), Spectre simulations, and hardware measurements) of the coupling effects returned by the nine stages of the example shown in FIG. 3. The x-axis of the plot in FIG. 4 is the PSRO chip mean (the average of the process screen ring oscillators placed on the 4 corners of the chip, this ring oscillator being a baseline for all performance data on each individual chip) and the y-axis is the ring oscillator with the coupling rings. The various "color" labeled data points and regression lines are the different coupling modes using the same ring oscillator. The differences between the lines are solely due to coupling affects of the different stages 108. Thus, as shown in FIG. 4, all coupling effects are easily calculated by the embodiments herein. The plot in FIG. 4 shows the results of 200 um of M1 wiring with minimal spacing. However, again, these examples are only presented to illustrate how the invention operates, and do not limit the application of the invention.

Figure 5:
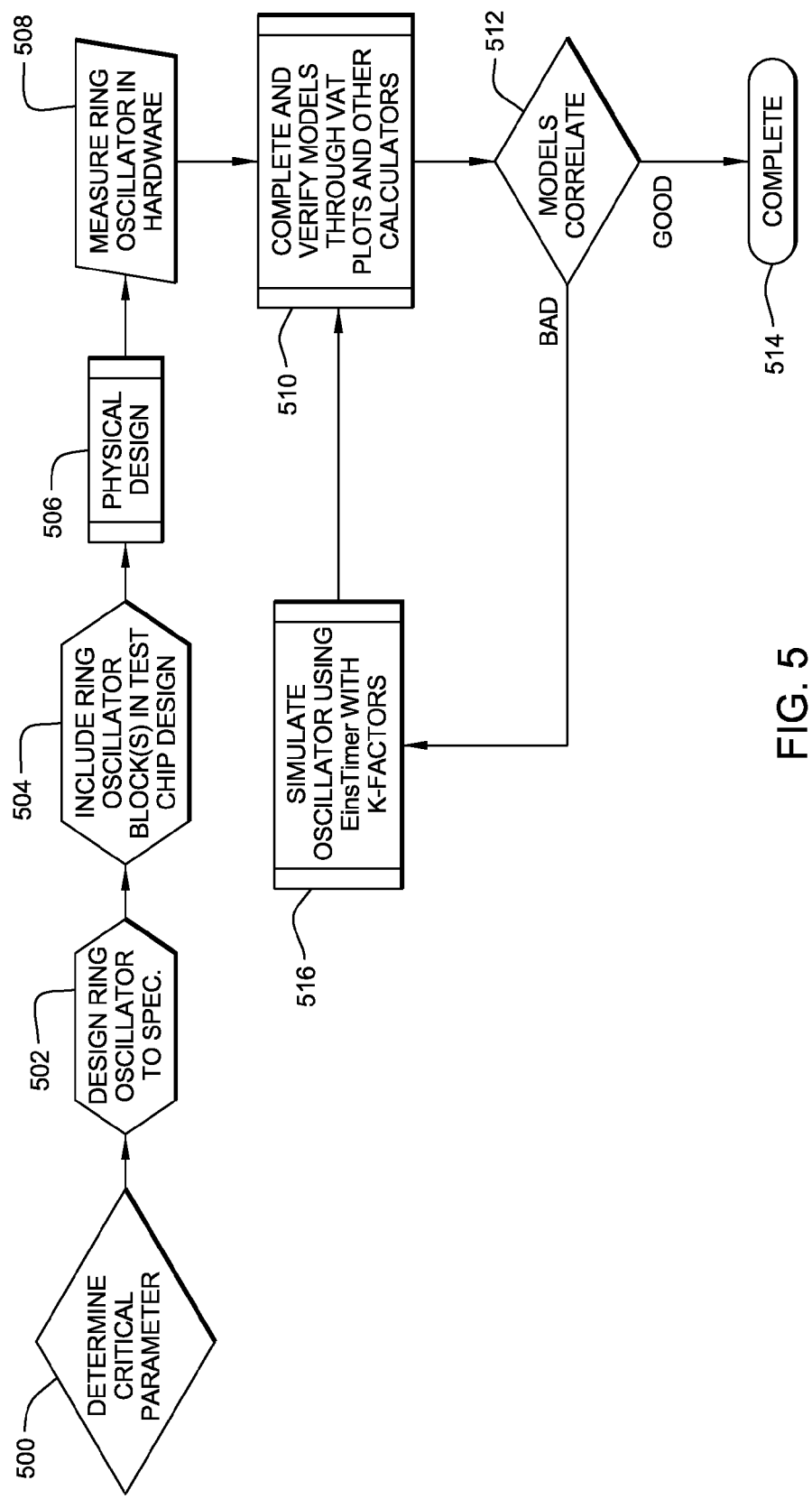
FIG. 5 is a flow diagram illustrating operations of embodiments herein.

As shown in FIG. 5, a method herein, in a computer-aided design system for generating a functional design model of an integrated circuit design (having nets comprising wires) determines critical parameters for coupling noise between the wires of the nets and acceptable limits for the critical parameters, in item 500.

Further, as shown in item 502, methods herein design a ring oscillator to have stages, each of the stages measuring only one of the critical parameters and each stage measures a different critical parameter. When designing the ring oscillator, each of the stages is designed to have identical placement and wiring. Further, the stages of the ring oscillator measure in-phase coupling, and the stages of the ring oscillator measure out-of-phase coupling. Similarly, the stages of the ring oscillator measure an aggressor net below a victim net, and the stages of the ring oscillator measure an aggressor net above the victim net.

This ring oscillator is then included within an integrated circuit design in item 504. Further, the ring oscillator is positioned within the integrated circuit design such that no wires intersect the ring oscillator. The embodiments herein actually produce an integrated circuit according to this integrated circuit design, in item 506, and operate the ring oscillator within the integrated circuit to measure the critical parameters of the integrated circuit (item 508). In item 510, the method produces test results to correlate and verify models through VAT plots (such as that shown in FIG. 4) and other calculations.

These test results are output to determine whether the test results are within the acceptable limits in item 512. If the test results are within the acceptable limits, the process is complete in item 514. To the contrary, if the test results are not within the acceptable limits, the embodiments herein simulate the ring oscillator using timing measurements in item 516.

Figure 6:
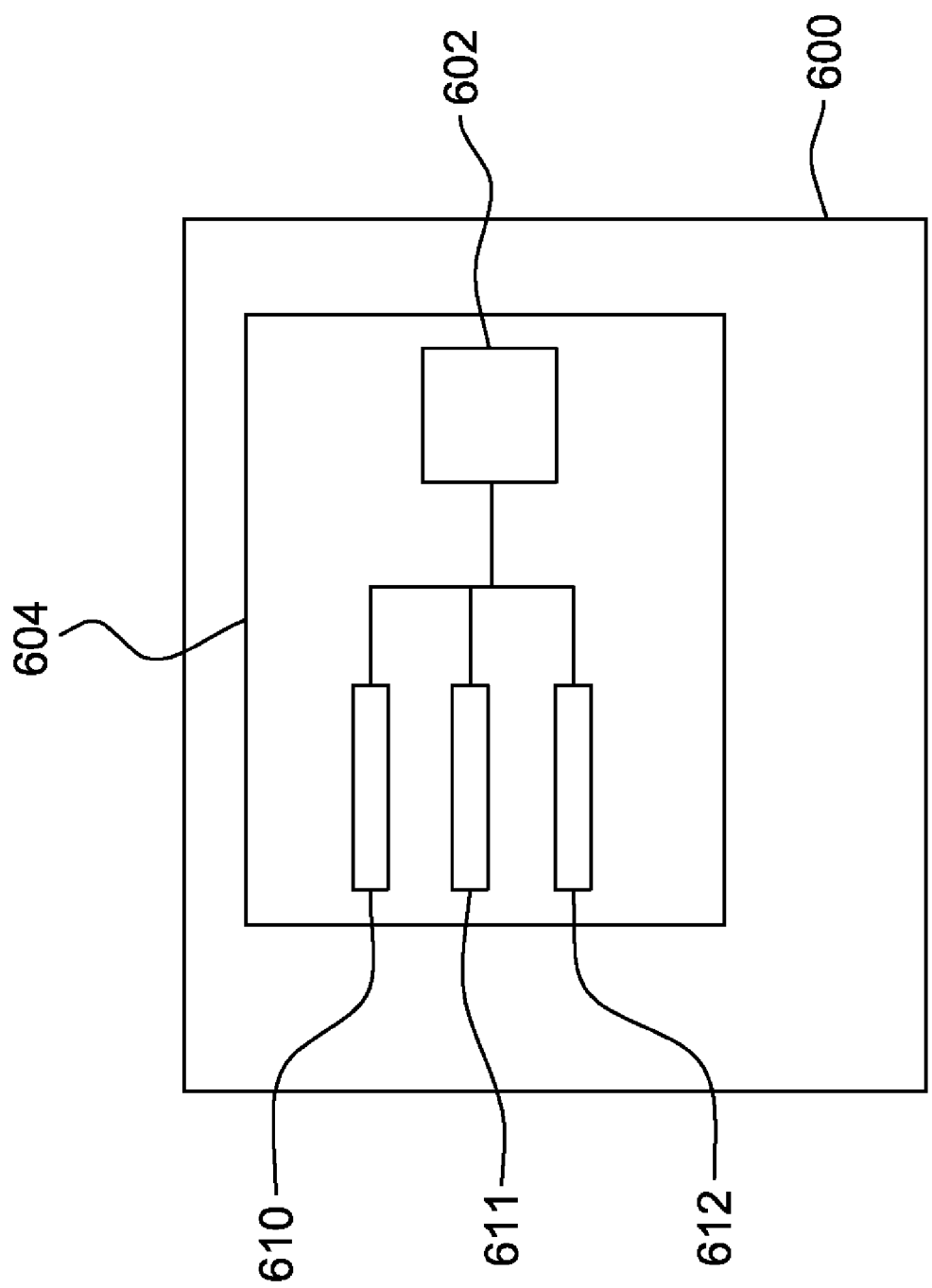
FIG. 6 is schematic diagram of an integrated circuit chip having the ring oscillator shown in FIG. 1, according to embodiments herein.

FIG. 6 is a schematic diagram of an integrated circuit chip (or portion of a chip) 600 and, therefore, represents a simplified apparatus embodiment and design structure embodiment herein. The integrated circuit has nets 610-612 that comprise wires that can be affected by coupling noise. For example, net 611 could be the victim net and items 610 and 612 could be the upper and lower aggressor nets, respectively. Again, the integrated circuit design used to manufacture the integrated circuit has critical parameters for coupling noise between the wires of the nets and acceptable limits for the critical parameters.

Further, the integrated circuit has a ring oscillator 602 operatively connected to the nets. A gate array isolator 604 can be used under the nets and surrounding the ring oscillator to isolate the nets and the ring oscillator from other designs within the integrated circuit. Thus, a gate array back-fill 604 can be used under the victim 611 and aggressor nets 610, 612, allowing for a uniform environment. The gate array back-fill 604 also surrounds the perimeter of the oscillator 602.

As discussed above, each stage within the oscillator 602 is identical in placement and wiring and the aggressor and victim paths 610-612 are laid out identically. As shown in FIG. 6, no other wires (including power) intersect the oscillator, especially the victim and aggressor nets.

The resulting integrated circuit chip shown in FIG. 6 can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Thus, as shown above, the embodiments herein provide a method to calibrate and measure coupled noise effects on adjacent wires based on frequency measurements that eliminate physical design differences, when compared to using multiple ring oscillators. As shown above, the embodiments herein can measure in-phase and out-of-phase coupling, can measure and correlate wire delay, and can be used with varying wire lengths, wire widths, wiring levels, wire types, and wire spacing. For example, and without limiting the application of the invention, the embodiments herein can be applied to long wires (wire lengths of 200 um, 500 um, etc.); to multiple wire widths (single width, double width, etc.); to different wire levels (M1, M2, M3, etc.); to different wire types (isolated wires, shielded wires, etc.); to different wire spacing (minimum, two wire grid spacing, etc.).

The embodiments herein allow correlation and verification of k-factors in the timing tools, and correlation and verification of wire load models. This provides increased modeling accuracy, which results in improved timing models, thereby decreasing risk of timing failures, and improving the competitive value of a product.

Figure 7:
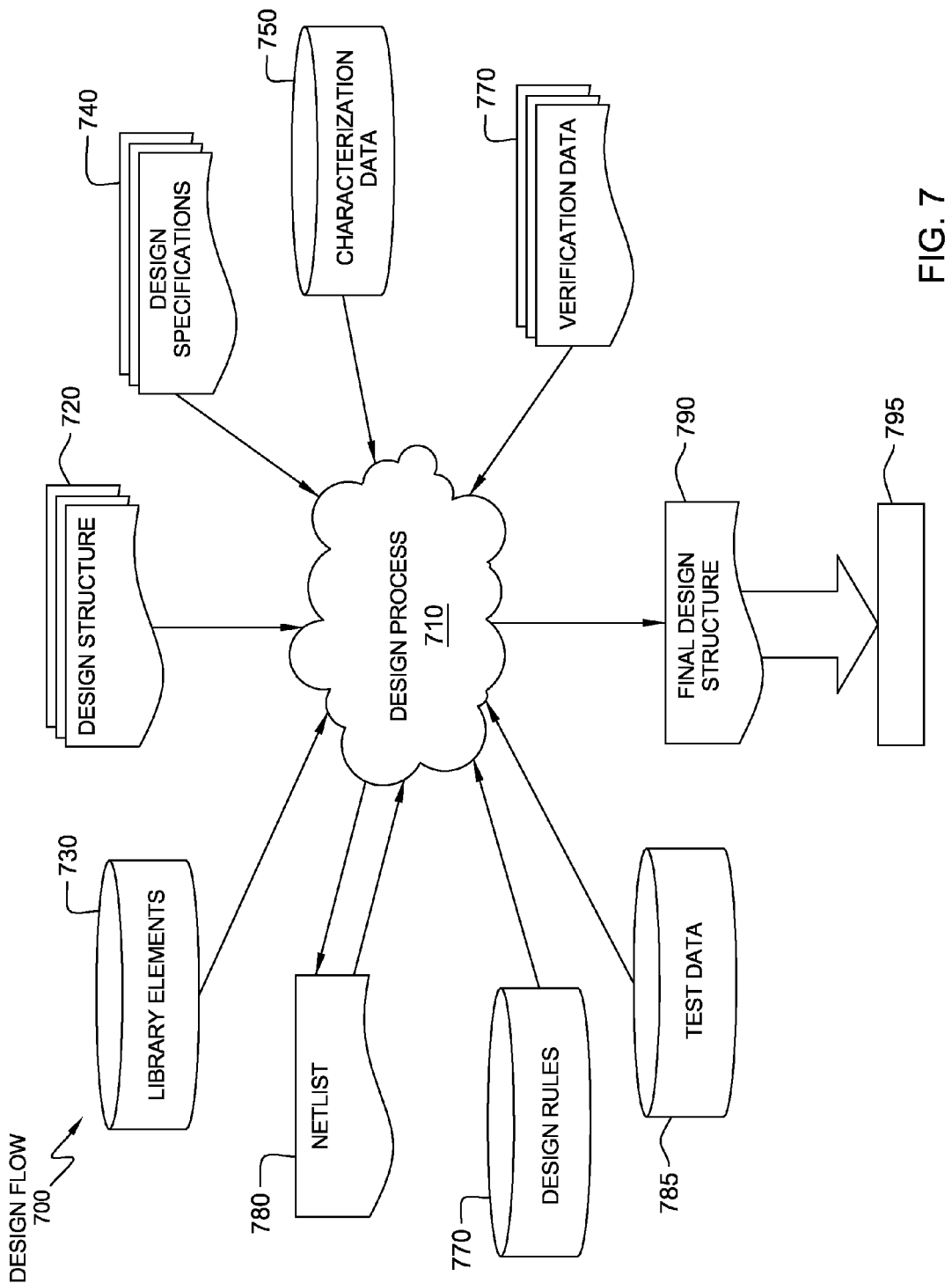
FIG. 7 is a flow diagram of a design process used in semiconductor design, manufacture, and/or test.

FIG. 7 shows a block diagram of an exemplary design flow 700 used for example, in semiconductor IC logic design, simulation, test, layout, and manufacture. Design flow 700 includes processes, machines and/or mechanisms for processing design structures or devices to generate logically or otherwise functionally equivalent representations of the design structures and/or devices described above and shown in FIGS. 1, 2, and 6. The design structures processed and/or generated by design flow 700 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a machine-readable data transmission, gate array, or storage medium, design structure 720 may be accessed and processed by one or more hardware and/or software modules within design process 710 to simulate or otherwise functionally represent an electronic component, circuit, electronic or logic module, apparatus, device, or system such as those shown in FIGS. 1, 2, and 6. As such, design structure 720 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of the components, circuits, devices, or logic structures shown in FIGS. 1, 2, and 6 to generate a netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 710 may include hardware and software modules for processing a variety of input data structure types including netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 2, and 6. In one embodiment, design structure 790 may comprise a compiled, executable HDL simulation model that functionally simulates the devices shown in FIGS. 1, 2, and 6.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 2, and 6. Design structure 790 may then proceed to a stage 795 where, for example, design structure 790: proceeds to tape-out, is released to manufacturing, is released to a mask house, is sent to another design house, is sent back to the customer, etc.

The embodiments of the invention can take the form of an entirely hardware embodiment, an entirely software embodiment or an embodiment including both hardware and software elements. In a preferred embodiment, the invention is implemented in software, which includes but is not limited to firmware, resident software, microcode, etc.

Furthermore, the embodiments of the invention can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk, and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 8:
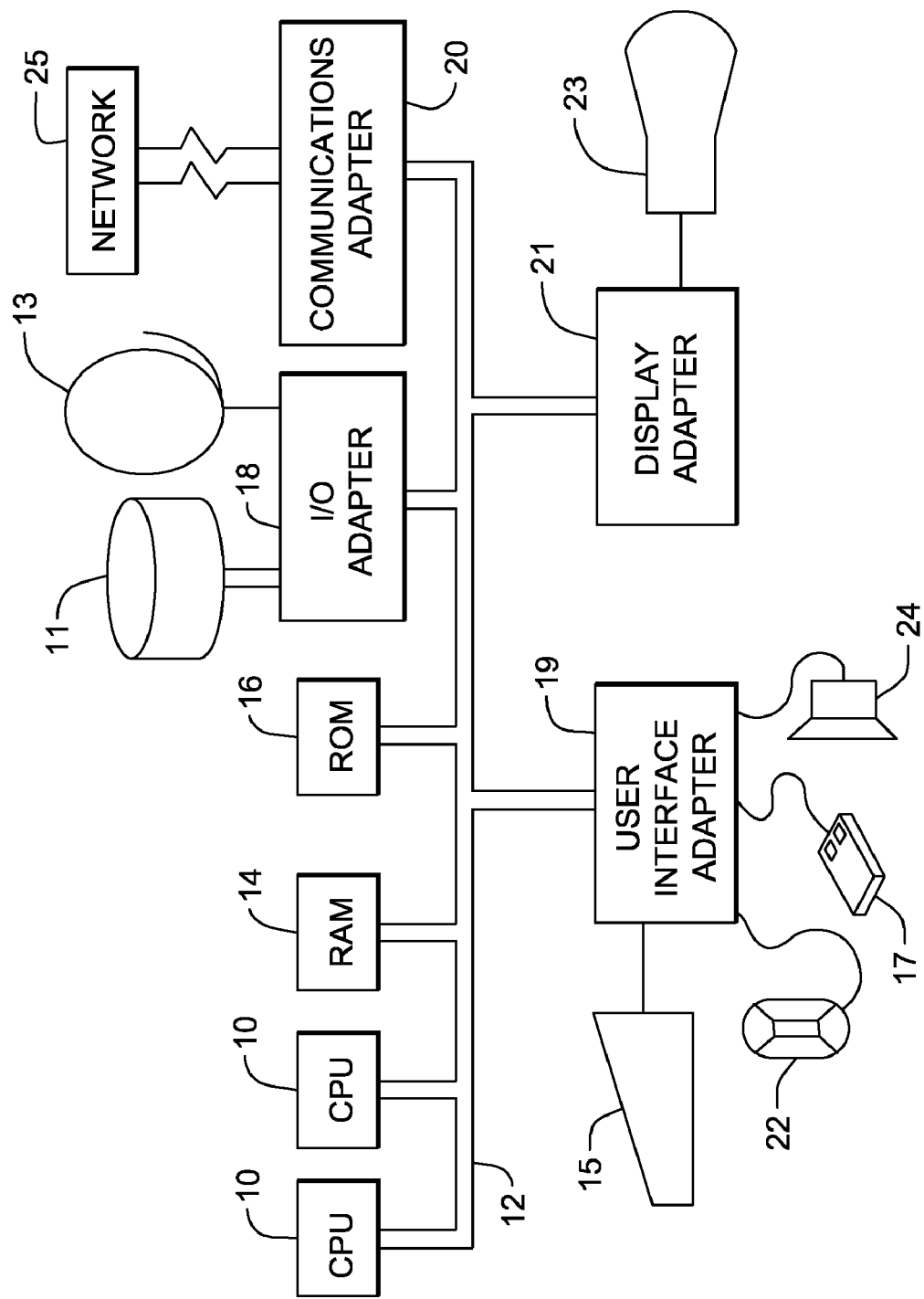
FIG. 8 is a schematic diagram illustrating an exemplary hardware environment that can be used to implement the embodiments of the invention.

A representative hardware environment for practicing the embodiments of the invention is depicted in FIG. 8. This schematic drawing illustrates a hardware configuration of an information handling/computer system in accordance with the embodiments of the invention. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments of the invention. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

What is claimed is:

1. An integrated circuit comprising:
   nets comprising relative aggressor nets and relative victim nets, said relative aggressor nets and said relative victim nets each comprising wires; and
   a ring oscillator operatively connected to said nets,
   said ring oscillator comprising stages, each of said stages measuring a different one of a plurality of critical parameters for coupling noise between said wires of said nets,
   said ring oscillator producing test results by measuring said critical parameters, and
   said ring oscillator comprising an output that outputs said test results.

2. The integrated circuit according to claim 1, said aggressor nets and said victim nets being laid out identically within said integrated circuit.

3. The integrated circuit according to claim 1, said stages of said ring oscillator measuring in-phase coupling, said stages of said ring oscillator measuring out-of-phase coupling, said stages of said ring oscillator measuring an aggressor net below a victim net, and said stages of said ring oscillator measuring an aggressor net above said victim net.

4. The integrated circuit according to claim 1, each of said stages of said oscillator comprising identical placement and wiring.

5. The integrated circuit according to claim 1, said ring oscillator being positioned such that none of said wires intersect said ring oscillator.

6. An integrated circuit comprising:
   nets comprising wires;
   a ring oscillator operatively connected to said nets; and
   a gate array isolator under said nets and surrounding said ring oscillator, said isolator isolating said nets and said ring oscillator from other portions of said integrated circuit,
   said ring oscillator comprising stages, each of said stages measuring a different one of a plurality of critical parameters for coupling noise between said wires of said nets,
   said ring oscillator producing test results by measuring said critical parameters, and
   said ring oscillator comprising an output that outputs said test results.

7. The integrated circuit according to claim 6, said nets comprising relative aggressor nets and relative victim nets, said aggressor nets and said victim nets being laid out identically within said integrated circuit.

8. The integrated circuit according to claim 6, said nets comprising relative aggressor nets and relative victim nets, said stages of said ring oscillator measuring in-phase coupling, said stages of said ring oscillator measuring out-of-phase coupling, said stages of said ring oscillator measuring an aggressor net below a victim net, and said stages of said ring oscillator measuring an aggressor net above said victim net.

9. The integrated circuit according to claim 6, each of said stages of said oscillator comprising identical placement and wiring.

10. The integrated circuit according to claim 6, said ring oscillator being positioned such that none of said wires intersect said ring oscillator.

11. A hardware description language (HDL) design structure tangibly embodied in a non-transitory computer machine readable medium processed by a computer for at least one of designing, manufacturing, and testing an integrated circuit,
    said HDL design structure is processed by said computer to yield a graphical representation of said integrated circuit, said integrated circuit comprising:
    nets comprising relative aggressor nets and relative victim nets, said relative aggressor nets and said relative victim nets each comprising wires; and
    a ring oscillator operatively connected to said nets,
    said ring oscillator comprising stages, each of said stages measuring a different one of a plurality of critical parameters for coupling noise between said wires of said nets,
    said ring oscillator producing test results by measuring said critical parameters, and
    said ring oscillator comprising an output that outputs said test results.

12. The design structure according to claim 11, said design structure comprising a netlist.

13. The design structure according to claim 11, said design structure residing on storage medium as a data format used for the exchange of layout data of integrated circuits.

14. The design structure according to claim 11, said design structure including at least one of test data, characterization data, verification data, and design specifications.

15. The design structure according to claim 11, said stages of said ring oscillator measuring in-phase coupling, said stages of said ring oscillator measuring out-of-phase coupling, said stages of said ring oscillator measuring an aggressor net below a victim net, and said stages of said ring oscillator measuring an aggressor net above said victim net.

16. A hardware description language (HDL) design structure tangibly embodied in a non-transitory computer machine readable medium processed by a computer for at least one of designing, manufacturing, and testing an integrated circuit,
    said HDL design structure is processed by said computer to yield a graphical representation of said integrated circuit, said integrated circuit comprising:
    nets comprising wires;
    a ring oscillator operatively connected to said nets; and
    a gate array isolator under said nets and surrounding said ring oscillator, said isolator isolating said nets and said ring oscillator from other portions of said integrated circuit,
    said ring oscillator comprising stages, each of said stages measuring a different one of a plurality of critical parameters for coupling noise between said wires of said nets,
    said ring oscillator producing test results by measuring said critical parameters, and
    said ring oscillator comprising an output that outputs said test results.

17. The design structure according to claim 16, said design structure comprising a netlist.

18. The design structure according to claim 16, said design structure residing on storage medium as a data format used for the exchange of layout data of integrated circuits.

19. The design structure according to claim 16, said design structure including at least one of test data, characterization data, verification data, and design specifications.

20. The design structure according to claim 16, said nets comprising relative aggressor nets and relative victim nets, said stages of said ring oscillator measuring in-phase coupling, said stages of said ring oscillator measuring out-of-phase coupling, said stages of said ring oscillator measuring an aggressor net below a victim net, and said stages of said ring oscillator measuring an aggressor net above said victim net.

* * * * *